US009123708B2

(12) United States Patent
Hosseini et al.

(10) Patent No.: US 9,123,708 B2
(45) Date of Patent: Sep. 1, 2015

(54) SEMICONDUCTOR CHIP PACKAGE (71) Applicant: Infineon Technologies Austria AG, Villach (AT)

(72) Inventors: Khalil Hosseini, Weihmichl (DE); Thomas Wowra, Munich (DE); Joachim Mahler, Regensburg (DE); Ralf Wombacher, Burglengenfeld (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 13/782,440

(22) Filed: Mar. 1, 2013

(65) Prior Publication Data
US 2014/0246766 A1   Sep. 4, 2014

(51) Int. Cl.
*H01L 23/495* (2006.01)
*H01L 23/48* (2006.01)
(Continued)

(52) U.S. Cl.
CPC .............. *H01L 23/495* (2013.01); *H01L 23/48* (2013.01); *H01L 23/49524* (2013.01); *H01L 23/49562* (2013.01); *H01L 24/24* (2013.01); *H01L 24/82* (2013.01); *H01L 23/295* (2013.01); *H01L 2224/05624* (2013.01); *H01L 2224/05644* (2013.01); *H01L 2224/05647* (2013.01); *H01L 2224/06181* (2013.01); *H01L 2224/24011* (2013.01); *H01L 2224/24246* (2013.01); *H01L 2224/32245* (2013.01); *H01L 2224/73267* (2013.01); *H01L 2924/12041* (2013.01); *H01L 2924/1305* (2013.01); *H01L 2924/13055* (2013.01); *H01L 2924/13091* (2013.01);

(Continued)

(58) Field of Classification Search
CPC . H01L 23/5389; H01L 24/82; H01L 23/4952; H01L 23/49524; H01L 23/49527; H01L 23/49531; H01L 23/49534; H01L 23/49537; H01L 23/498; H01L 23/49805; H01L 23/49811; H01L 23/49822
USPC .................. 257/678–700, E21.502, 727–728; 438/123–127
See application file for complete search history.

(56) References Cited

U.S. PATENT DOCUMENTS 5,313,092 A * 5/1994 Tsuruta et al. ................ 257/620
5,726,493 A   3/1998 Yamashita et al.
8,017,452 B2 * 9/2011 Ishihara et al. ............... 438/127
(Continued)

FOREIGN PATENT DOCUMENTS

DE   102006021959 A1   11/2007
DE   102009040557 A1    5/2010
(Continued)

*Primary Examiner* — Jae Lee
*Assistant Examiner* — Mohammed R Alam
(74) *Attorney, Agent, or Firm* — Slater & Matsil, L.L.P.

(57) ABSTRACT

The semiconductor chip package comprises a carrier, a semiconductor chip comprising a first main face and a second main face opposite to the first main face, chip contact elements disposed on one or more of the first or second main faces of the semiconductor chip, an encapsulation layer covering the first main face of the semiconductor chip, the encapsulation layer comprising a first main face facing the carrier and a second main face remote from the carrier, first contact elements disposed on the second main face of the encapsulation layer, each one of the first contact elements being connected to one of the chip contact elements, and second contact elements disposed on the first main face of the encapsulation layer, each one of the second contact elements being connected to one of the chip contact elements.

18 Claims, 6 Drawing Sheets (51) Int. Cl.
   *H01L 23/00*   (2006.01)
   *H01L 23/29*   (2006.01)
(52) U.S. Cl.
   CPC ... *H01L2924/141* (2013.01); *H01L 2924/1431* (2013.01); *H01L 2924/1461* (2013.01)

(56) References Cited

U.S. PATENT DOCUMENTS

| | | | |
|---|---|---|---|
| 2007/0085201 A1* | 4/2007 | Bauer et al. | 257/728 |
| 2009/0050994 A1* | 2/2009 | Ishihara et al. | 257/432 |
| 2009/0160046 A1* | 6/2009 | Otremba et al. | 257/700 |
| 2010/0044841 A1* | 2/2010 | Mahler et al. | 257/675 |
| 2010/0224986 A1* | 9/2010 | Kojima et al. | 257/692 |
| 2011/0198743 A1* | 8/2011 | Nikitin et al. | 257/690 |
| 2011/0312134 A1* | 12/2011 | Machida | 438/123 |

FOREIGN PATENT DOCUMENTS

| | | |
|---|---|---|
| DE | 102009042320 A1 | 7/2010 |
| JP | 722567 A | 1/1995 |

* cited by examiner

SEMICONDUCTOR CHIP PACKAGE

TECHNICAL FIELD

The present invention relates to a semiconductor chip package.

BACKGROUND

In the field of fabrication of semiconductor chip packages an increased desire can be observed to fabricate the semiconductor chip packages in a way that they meet individual needs of consumers. Industrial consumers have a desire to efficiently attach semiconductor packages to boards like printed circuit boards (PCB) and quality-check the boards for performance and function prior to sale. Semiconductor chips include contact pads or contact elements on one or more of their surfaces. In a semiconductor chip package the semiconductor chip is embedded or housed within the chip package and the contact pads of the semiconductor chip are connected to external contact elements of the chip package. It is desirable to fabricate semiconductor chip packages so that their external contact elements allow a higher degree of flexibility as regards the attachment of the semiconductor chip package to a board and also the modular applicability of the semiconductor chip package, in particular the possibility to connect further devices to the semiconductor chip package.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION OF ILLUSTRATIVE EMBODIMENTS

The aspects and embodiments are now described with reference to the drawings, wherein like reference numerals are generally utilized to refer to like elements throughout. In the following description, for purposes of explanation, numerous specific details are set forth in order to provide a thorough understanding of one or more aspects of the embodiments. It may be evident, however, to one skilled in the art that one or more aspects of the embodiments may be practiced with a lesser degree of the specific details. In other instances, known structures and elements are shown in schematic form in order to facilitate describing one or more aspects of the embodiments. It is to be understood that other embodiments may be utilized and structural or logical changes may be made without departing from the scope of the present invention. It should be noted further that the drawings are not to scale or not necessarily to scale.

In addition, while a particular feature or aspect of an embodiment may be disclosed with respect to only one of several implementations, such feature or aspect may be combined with one or more other features or aspects of the other implementations as may be desired and advantageous for any given or particular application. Furthermore, to the extent that the terms "include," "have," "with" or other variants thereof are used in either the detailed description or the claims, such terms are intended to be inclusive in a manner similar to the term "comprise." The terms "coupled" and "connected," along with derivatives may be used. It should be understood that these terms may be used to indicate that two elements cooperate or interact with each other regardless whether they are in direct physical or electrical contact, or they are not in direct contact with each other. Also, the term "exemplary" is merely meant as an example, rather than the best or optimal. The following detailed description, therefore, is not to be taken in a limiting sense, and the scope of the present invention is defined by the appended claims.

The embodiments of a semiconductor chip package may use various types of semiconductor chips or semiconductor chip modules or circuits incorporated in the semiconductor chips, among them logic integrated circuits, analogue integrated circuits, mixed signal integrated circuits, sensor circuits, MEMS (Micro-Electro-Mechanical-Systems), power integrated circuits, chips with integrated passives, diodes like flyback diodes, etc. The embodiments may also use semiconductor chips comprising MOS transistor structures or vertical transistor structures like, for example, IGBT (Insulated Gate Bipolar Transistor) structures or, in general, transistors or other structures or devices in which at least one electrical contact pad is arranged on a first main face of the semiconductor chip and at least one other electrical contact pad is arranged on a second main face of the semiconductor chip opposite to the first main face of the semiconductor chip. The semiconductor chips may also comprise optical devices like, for example, light emitting diodes, laser diodes, or optical receiver diodes.

The semiconductor chips may comprise contact elements or contact pads on one or more of their outer surfaces wherein the contact elements serve for electrically contacting the semiconductor chips. The contact elements may have any desired form or shape. They can, for example, have the form of lands, i.e., flat contact layers on an outer surface of the semiconductor chip. The contact elements or contact pads may be made from any electrically conducting material, e.g., from a metal as aluminum, gold, or copper, for example, or a metal alloy, or an electrically conducting organic material, or an electrically conducting semiconductor material. The contact elements may also be formed as layer stacks of one or more of the above-mentioned materials.

The embodiments of a semiconductor chip package may comprise an encapsulant or encapsulating material having the semiconductor chips or semiconductor chip modules embedded therein. The encapsulating material can be any electrically insulating material like, for example, any kind of molding material, any kind of resin material, or any kind of epoxy material. The encapsulating material can also be a polymer material, a polyimide material, a thermoplast material, a silicone material, a ceramic material, and a glass material. The encapsulating material may also comprise any of the above-mentioned materials and further include filler materials embedded therein like, for example, thermally conductive increments. These filler increments can be made of AlO or $Al_2O_3$, AlN, BN, or SiN, for example. The semiconductor chip panel fabricated by an embodiment of the method can have the form of a wafer, i.e., a circular form, but is not limited to the form and shape of a wafer but can have any size and shape and any suitable arrangement of semiconductor chips or semiconductor chip modules embedded therein.

Embodiments of a semiconductor device may include one or more of individual semiconductor chips or semiconductor chip modules. The semiconductor chip modules may include one or more semiconductor chips, in particular power transistor chips, and they may include at least one further semiconductor chip which may include one or more of a logic circuit or a driver circuit. In particular, the semiconductor chip modules may comprise the so-called intelligent power modules (IPMs). The semiconductor device may also comprise any other kind of semiconductor chips as were mentioned above. The semiconductor device may comprise semiconductor chips arranged in a stacked configuration, i.e., arranged in different levels one above the other. The semiconductor device may also comprise semiconductor chips connected with each other to form a bridge circuit, i.e., a half-bridge circuit or a full-bridge circuit, such as those used for power switch modules.

Figure 1A:
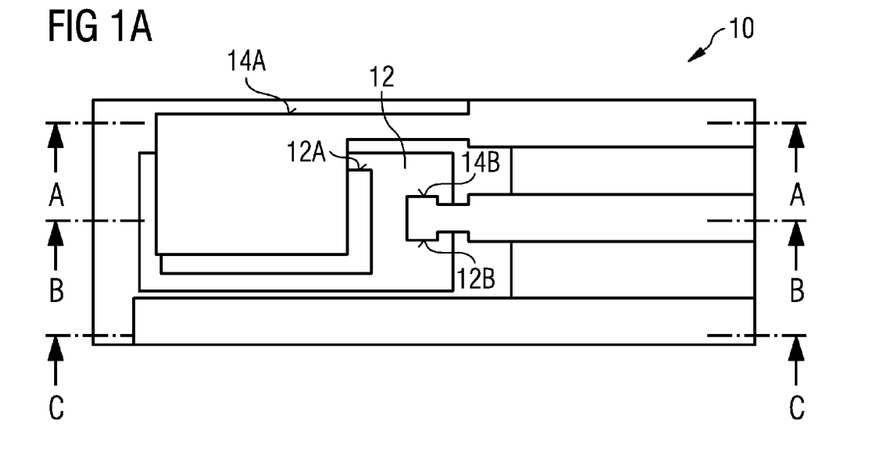
FIGS. 1A and 1B show a schematic top view representation (FIG. 1A) and cross-sectional side view representations (FIG. 1B) for illustrating an example of a semiconductor chip package having additional peripheral contact areas connected with additional external contact pins.
Figure 1B:
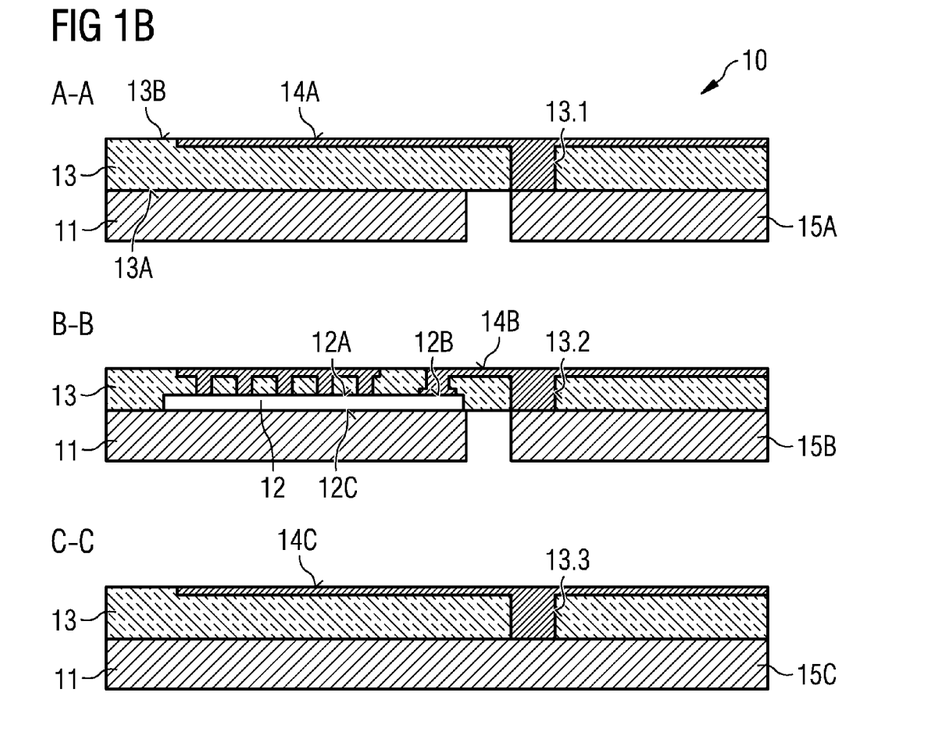

FIG. 1 shows an example of a semiconductor chip package 10 in a top view representation (FIG. 1A) and three different cross-sectional side view representations (FIG. 1B) along lines A-A, B-B, and C-C. The semiconductor chip package 10 comprises a carrier 11, a semiconductor chip 12 comprising an upper first main face and a lower second main face opposite to the upper first main face and side faces connecting the first and second main faces, and chip contact elements 12A, 12B and 12C disposed on one or more of the first or second main faces. The semiconductor chip 12 can be applied onto the carrier 11 with the second lower main face facing the carrier 11. The semiconductor chip package 10 further comprises an encapsulation layer 13 covering the upper first main face and the side faces of the semiconductor chip 12, the encapsulation layer 13 comprising a lower first main face 13A facing the carrier 11 and an upper second main face 13B remote from the carrier 11. The semiconductor chip package 10 further comprises first contact elements 14A, 14B and 14C disposed on the upper second main face 13B of the encapsulation layer 13, wherein each one of the first contact elements 14A, 14B and 14C is connected to one of the chip contact elements 12A, 12B and 12C. The semiconductor chip package 10 further comprises second contact elements 15A, 15B and 15C disposed on the lower first main face 13A of the encapsulation layer 13, wherein each one of the second contact elements 15A, 15B and 15C is connected to one of the chip contact elements 12A, 12B and 12C.

As will be outlined in further detail below, the semiconductor chip package 10 of FIG. 1 and of the further examples shown in this application comprises an increased functionality, practicability and usefulness as regards possible ways of connecting the semiconductor chip package to a board like a printed circuit board (PCB) and also possible ways of connecting further devices to the semiconductor chip package. The semiconductor chip package 10 can be fabricated in the form of a surface mounted device (SMD), wherein the first electrical contact elements can be utilized as means for connecting the semiconductor chip package to a board. The semiconductor chip package 10 can also be fabricated as a through-hole device, wherein the second electrical contact elements 15A-C can be utilized as means for connecting the semiconductor chip package 10 to a board. Moreover, either the first electrical contact elements 14A-C or third electrical contact elements (not shown in FIGS. 1A and 1B) can be utilized as means for connecting the semiconductor chip package 10 to further devices.

According to an embodiment of the semiconductor chip package 10 of FIG. 1, the first electrical contact elements 14A-C are configured as contact layers applied on the second main face 13B of the encapsulation layer 13. The materials to be used for the first electrical contact elements 14A-C can be any electrically conductive material like, for example, copper or a copper alloy and the layers can be deposited by, for example, galvanic plating, electroplating, or electroless plating.

According to an embodiment of the semiconductor chip package 10 of FIG. 1, the second electrical contact elements 15A-C are configured as elongated, linear elements like, for example, leads, pins or bars.

According to an embodiment of the semiconductor chip package 10 of FIG. 1, the second electrical contact elements 15A-C are disposed and extend in one and the same plane as the carrier 11. In particular, one of the second electrical contact elements (15C) can be formed as an extension of the carrier 11 and it can also be formed contiguous with the carrier 11.

According to an embodiment of the semiconductor chip package 10 of FIG. 1, the second electrical contact elements 15A-C can be disposed within one and the same plane and comprise the same thickness. In particular, the second electrical contact elements 15A-C may comprise upper surfaces arranged within one and the same plane and lower surfaces arranged within one and the same plane. Moreover, the carrier 11 may also be arranged within one and the same plane as the second electrical contact elements 15A-C and may have an upper surface coplanar with the upper surfaces of the second electrical contact elements 15A-C and a lower surface coplanar with the lower surfaces of the second electrical contact elements 15A-C. In particular, the carrier 11 and the second electrical contact elements 15A-C may originate from one and the same leadframe which is contiguous at the beginning of the fabrication process and then separated into different portions during the fabrication process.

According to an embodiment of the semiconductor chip package 10 of FIG. 1, each one of the second electrical contact elements 15A-C is connected to one of the first contact elements 14A-C by an electrical through-connection 13.1, 13.2 or 13.3 formed in the encapsulation layer 13.

According to an embodiment of the semiconductor chip package 10 of FIG. 1, the semiconductor chip 12 comprises an electrical device comprising at least one contact element at the first main face of the semiconductor chip 12 and at least one contact element at the second main face of the semiconductor chip 12.

According to an embodiment of the semiconductor chip package 10 of FIG. 1, the semiconductor chip 12 comprises one or more of a vertical transistor, an MOS transistor, an IGB (Insulated Gate Bipolar) transistor, and a power transistor. In particular, the semiconductor chip 12 comprises a source contact element disposed on the first main face, a gate contact element disposed on the first main face, and a drain contact element disposed on the second main face.

According to an embodiment of the semiconductor chip package 10 of FIG. 1, the semiconductor chip 12 comprises a thickness in a range from 5 µm-150 µm.

According to an embodiment of the semiconductor chip package 10 of FIG. 1, the encapsulation layer 13 comprises one or more of an insulating material, a mold material, a laminate, a polymer material, a polyimide material, a resin material, an epoxy resin material, a silicone material, a ceramic material, and a glass material, wherein each one of these materials may comprise filler increments embedded therein.

According to an embodiment of the semiconductor chip package of FIG. 1, the first contact elements 14A-C may be connected with peripheral contact areas as shown in FIGS. 1A and 1B on the right side of the electrical through-connections 13.1-13.3 on the second main face 13B of the encapsulation layer 13.

According to an embodiment of the semiconductor chip package 10 of FIG. 1, the semiconductor chip package 10 further comprises third contact elements disposed on the second main face of the encapsulation layer 13. In particular, each one of the third contact elements may be connected to one of the second contact elements 15A-C by an electrical through-connection formed in the encapsulation layer 13. This will be shown in further detail in an example below.

According to an embodiment of the semiconductor chip package 10 of FIG. 1, the semiconductor chip package 10 further comprises at least one further device disposed on one or more of the first contact elements or on one or more of the third contact elements, if available. In particular, the further device comprises one or more of a semiconductor chip, an integrated circuit, a passive device, a capacitor, an inductor, a coil, a resistor, and a heat sink.

Figure 2A:
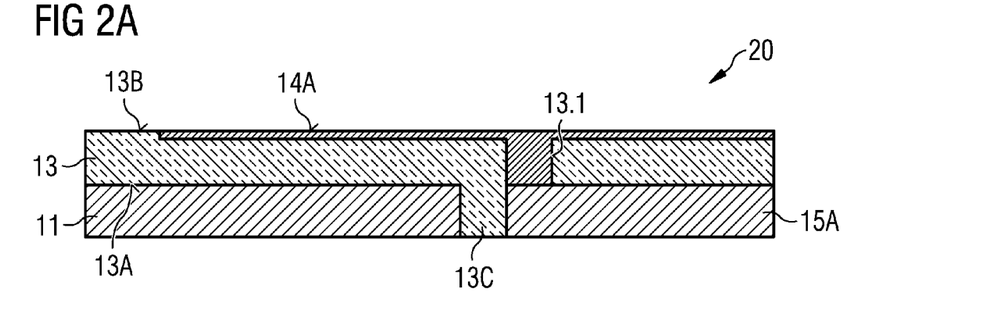
FIGS. 2A-2C show schematic cross-sectional side view representations for illustrating an example of a semiconductor chip package wherein, as compared to the example of FIGS. 1A and 1B, the spaces between the carrier and the external contact pins are filled with encapsulation material.
Figure 2B:
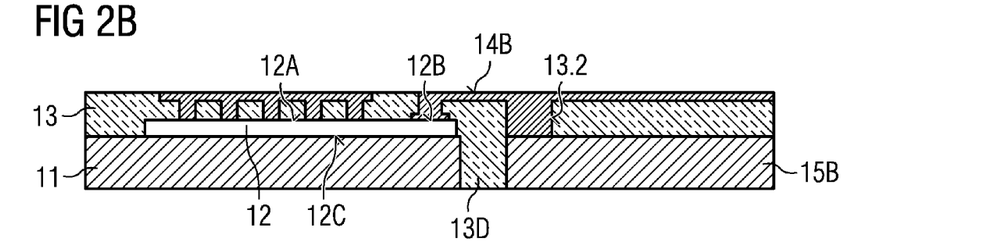
Figure 2C:
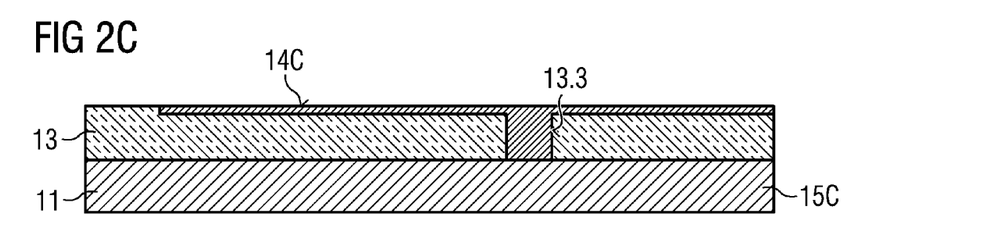

FIGS. 2A-2C illustrate a further example of a semiconductor chip package 20. The semiconductor chip package of FIG. 2 is similar to that one shown in FIGS. 1A and 1B so that elements with equal reference signs will not be described once more. The difference with respect to the semiconductor chip package 10 of FIGS. 1A and 1B is that the encapsulation layer 13 comprises protrusions 13C and 13D which extend from the encapsulation layer 13 in a vertical downward direction into the space between the carrier 11 and the second contact elements 15A and 15B. This can be accomplished by letting the encapsulation material flow into the empty spaces between the carrier 11 and the second contact elements 15A and 15B. With this measure the electrical break-through resistance of the device can be enhanced.

Figure 3A:
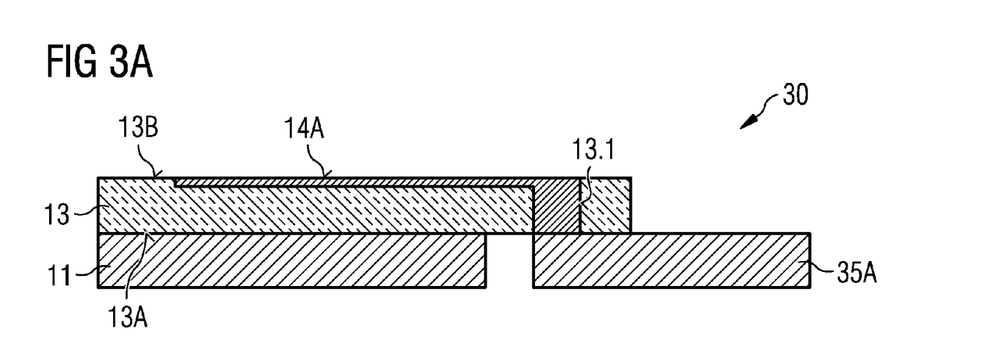
FIGS. 3A-3C show schematic cross-sectional side view representations for illustrating an example of a semiconductor chip package in which, as compared with the examples of FIGS. 1A and 1B and FIG. 2, the external contact pins are exposed.
Figure 3B:
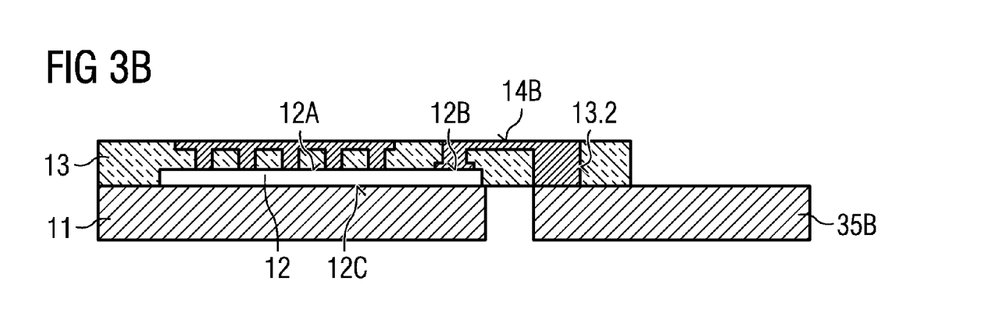
Figure 3C:
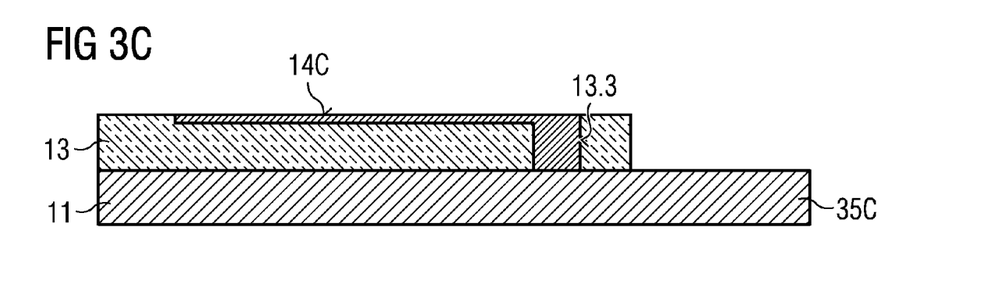

FIGS. 3A-3C illustrate a further example of a semiconductor chip package 30. As a difference to the previous examples, the semiconductor chip package 30 of FIG. 3 comprises second electrical contact elements 35A-C which are exposed to the outside. The semiconductor chip package 30 is thus fabricated in the form of a through-hole device which can be mounted on a board by through-hole technology (THT), wherein the second electrical contact elements 35A-C are put through or stuck through the board. The semiconductor chip package 30 of FIG. 3 can be fabricated by, for example, laser welding the second electrical contact elements 35A-C to the lower surface 13A of the encapsulation layer 13.

Figure 4A:
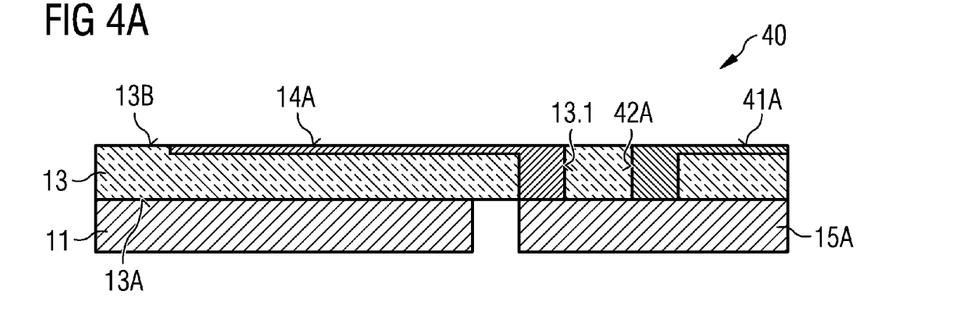
FIGS. 4A-4C show schematic cross-sectional side view representations for illustrating an example of a semiconductor chip package which comprises further contact areas.
Figure 4B:
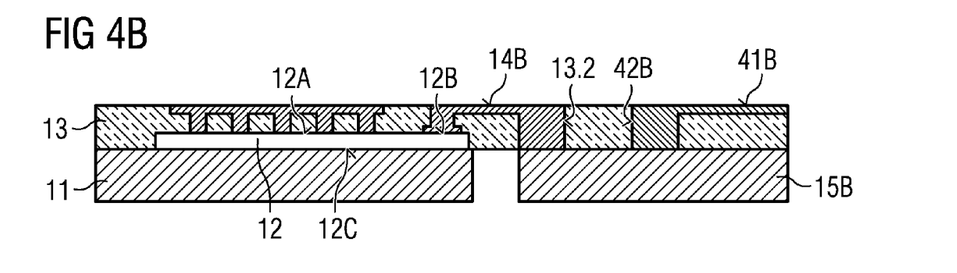
Figure 4C:
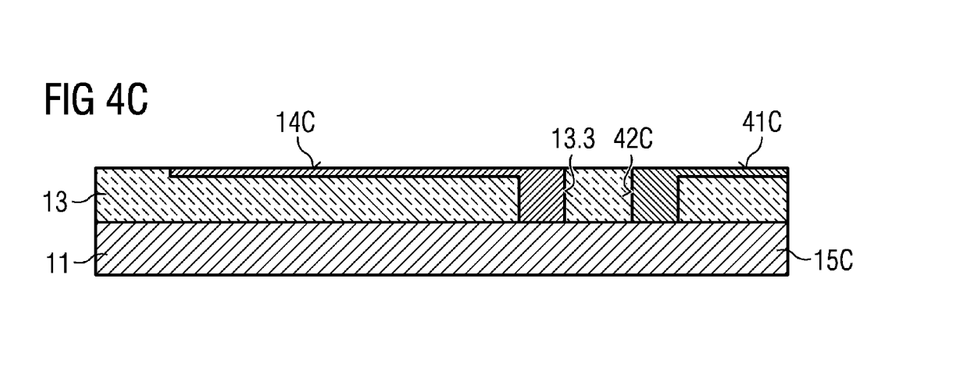

FIGS. 4A-4C illustrate a further example of a semiconductor chip package 40. As a difference to previous examples, the semiconductor chip 40 of FIG. 4 comprises third electrical contact elements 41A-C arranged in the form of contact layers on the second main face 13B of the encapsulation layer 13. Each one of the third electrical contact layers 41A-C can be connected with one of the second electrical contact elements 15A-C by an electrical through-connection 42A, 42B or 42C formed in the encapsulation layer 13. The third electrical contact elements 41A-C can be utilized as electrical contact layers for mounting further devices thereupon.

Figure 5A:
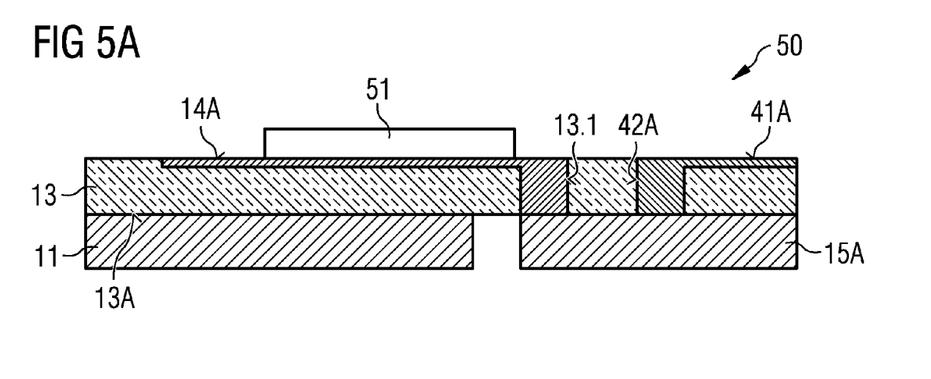
FIGS. 5A-5C show schematic cross-sectional side view representations for illustrating an example of a semiconductor chip package which, in addition to the example of FIG. 4, comprises further semiconductor chips applied contact areas.
Figure 5B:
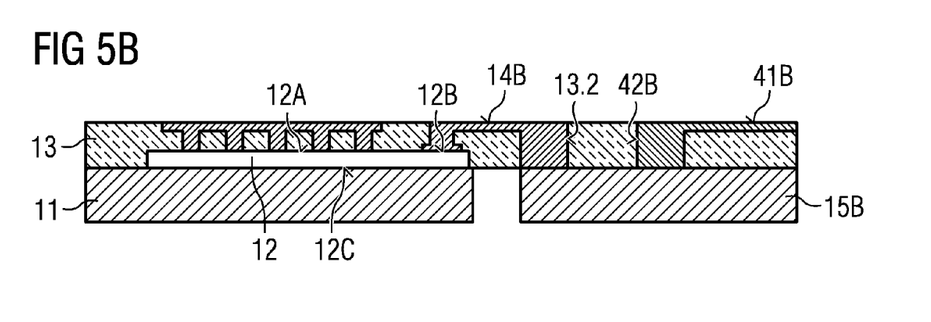
Figure 5C:
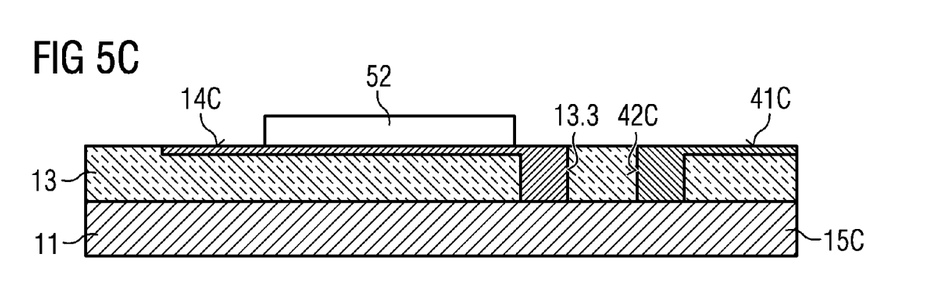

FIGS. 5A-5C show a further example of a semiconductor chip package 50. As a difference to the example shown in FIGS. 4A-4C, the semiconductor chip 50 of FIG. 5 comprises further electrical devices. In particular, the semiconductor chip package 50 comprises a first integrated circuit chip 51 mounted on first electrical contact element 14A, and a second integrated circuit chip 52 mounted on first electrical contact element 14C. One or both of the first and second integrated circuit chips 51 and 52 may function as controller chips for controlling the performance of the semiconductor chip 12. One or both of the integrated circuit chips 51 and 52 can also be mounted on one of the third electrical contact elements 41A-C.

Figure 6A:
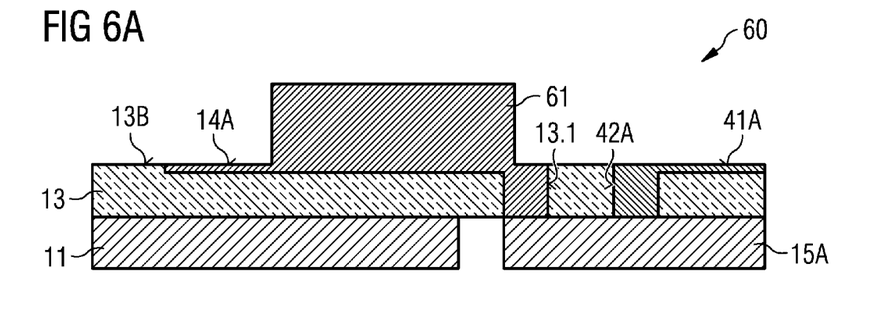
FIGS. 6A-6C show schematic cross-sectional side view representations for illustrating an example of a semiconductor chip package which, in addition to the example of FIG. 4, comprises further devices applied to contact areas.
Figure 6B:
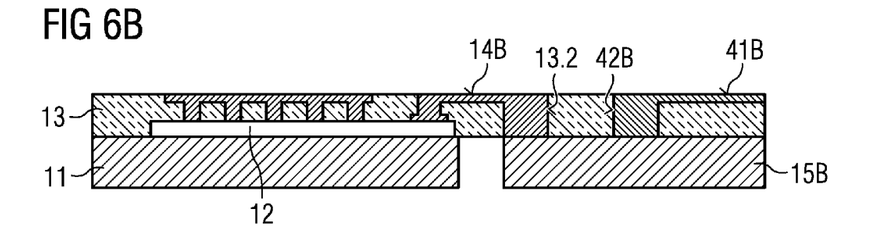
Figure 6C:
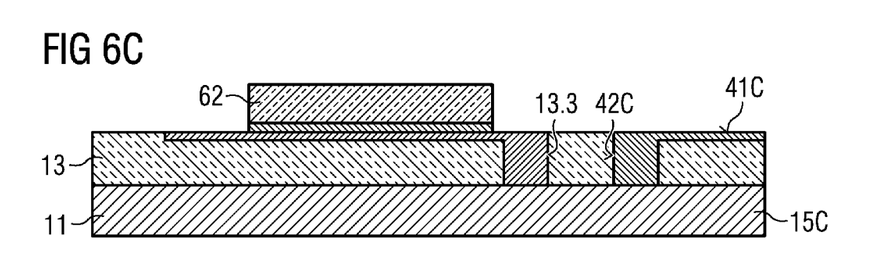

FIGS. 6A-6C illustrate a further example of a semiconductor chip package 60. As a difference to the example shown in FIGS. 5A-5C, other devices are mounted onto the first electrical contact elements 14A and 14C. A heat sink 61 is mounted on first electrical contact element 14A. The heat sink 61 may be comprised, for example, of a block of copper or a copper alloy and may be intended to dissipate heat generated in the semiconductor chip 12. Furthermore, a passive device 62 like, for example, a capacitor is mounted on first electrical contact element 14C. Again, one or more of the device 61 and 62 can also be applied onto one of the third electrical contact elements 41A-C.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention.

What is claimed is:
1. A semiconductor chip package, comprising:
  a carrier;
  a semiconductor chip comprising a first main face and a second main face opposite to the first main face, wherein chip contact elements are disposed on one or more of the first or second main faces of the semiconductor chip, and wherein the chip is disposed on the carrier;
  an encapsulation layer covering the first main face of the semiconductor chip, the encapsulation layer comprising a first main face facing the carrier and a second main face opposite to the first main face and remote from the carrier, wherein the encapsulation layer does not cover at least one side face of the carrier;

first contact elements disposed on the second main face of the encapsulation layer, each one of the first contact elements being connected to one of the chip contact elements; and second contact elements disposed on the first main face of the encapsulation layer, each one of the second contact elements being connected to one of the chip contact elements, wherein all of the second contact elements are disposed and extend entirely in the same plane as the carrier and at least one of the second contact elements is formed continuous with the carrier; and wherein the first and second contact elements are arranged on opposite main faces of the semiconductor chip package.

2. The semiconductor chip package according to claim 1, wherein the first contact elements are configured as contact layers applied on the second main face of the encapsulation layer.

3. The semiconductor chip package according to claim 1, wherein the second contact elements are configured as pins.

4. The semiconductor chip package according to claim 1, wherein each one of the second contact elements is connected to one of the first contact elements by an electrical through-connection formed in the encapsulation layer.

5. The semiconductor chip package according to claim 1, wherein the semiconductor chip comprises a vertical transistor, an MOS transistor, an IGB transistor, or a power transistor.

6. The semiconductor chip package according to claim 5, wherein the semiconductor chip comprises a source contact element disposed on the first main face, a gate contact element disposed on the first main face, and a drain contact element disposed on the second main face.

7. The semiconductor chip package according to claim 1, wherein the carrier and the second contact elements are fabricated from one and the same leadframe.

8. The semiconductor chip package according to claim 1, further comprising a further device disposed on one or more of the first contact elements.

9. The semiconductor chip package according to claim 8, wherein the further device comprises a semiconductor chip, an integrated circuit, a capacitor, an inductor, a coil, a resistor, or a heat sink.

10. The semiconductor chip package according to claim 1, further comprising third contact elements disposed on the first main face of the encapsulation layer.

11. The semiconductor chip package according to claim 10, wherein each one of the third contact elements is connected to one of the second contact elements by an electrical through-connection formed in the encapsulation layer.

12. A semiconductor chip package, comprising:

a semiconductor chip comprising a first main face and a second main face opposite to the first main face, the semiconductor chip also comprising chip contact elements disposed on one or more of the first or second main faces;

first external contact elements configured as contact layers, wherein each one of the contact layers is connected with one of the chip contact elements; and second external contact elements configured as contact pins, wherein each one of the contact pins is connected with one of the chip contact elements, and wherein the semiconductor chip package is configured as a surface mounted device and also as a through-hole mounted device.

13. The semiconductor chip package according to claim 12, wherein the first external contact elements are arranged on one side of a plane of the semiconductor chip and the second external contact elements are arranged on another side of the plane of the semiconductor chip.

14. The semiconductor chip package according to claim 12, wherein the semiconductor chip comprises a thickness in a range from 5 µm-150 µm.

15. A semiconductor chip package, comprising:

a carrier;

a semiconductor chip disposed on the carrier;

an encapsulation layer covering the semiconductor chip, the encapsulation layer comprising a first main face and a second main face opposite to the first main face;

first external contact elements disposed on the second main face of the encapsulation layer and connected with the semiconductor chip; and second external contact elements disposed on the first main face of the encapsulation layer and connected with the semiconductor chip, wherein the carrier and the second external contact elements are fabricated from one and the same leadframe, and wherein the second external contact elements entirely extend parallel to and in the same plane as the carrier.

16. The semiconductor chip package according to claim 15, wherein the first external contact elements are configured as contact layers and the second external contact elements are configured as pins.

17. The semiconductor chip package according to claim 15, further comprising third external contact elements disposed on the second main face of the encapsulation layer and connected with the semiconductor chip.

18. The semiconductor chip package according to claim 17, wherein the third external contact elements are configured as contact layers and are disposed in one and the same plane as the first external contact elements.

* * * * *